(12) United States Patent
Maxik

(10) Patent No.: US 7,086,756 B2
(45) Date of Patent: Aug. 8, 2006

(54) LIGHTING ELEMENT USING ELECTRONICALLY ACTIVATED LIGHT EMITTING ELEMENTS AND METHOD OF MAKING SAME

(75) Inventor: Fredric S. Maxik, Weston, FL (US)

(73) Assignee: Lighting Science Group Corporation, Dallas, TX (US)

( * ) Notice: Subject to any disclaimer, the term of this patent is extended or adjusted under 35 U.S.C. 154(b) by 0 days.

(21) Appl. No.: 10/915,278

(22) Filed: Aug. 9, 2004

(65) Prior Publication Data

US 2005/0207152 A1 Sep. 22, 2005

Related U.S. Application Data

(60) Provisional application No. 60/554,469, filed on Mar. 18, 2004.

(51) Int. Cl.
*F21V 21/00* (2006.01)
(52) U.S. Cl. .................. 362/249; 362/363; 362/800
(58) Field of Classification Search ........... 362/236, 362/249, 800, 246, 806, 363
See application file for complete search history.

(56) References Cited

U.S. PATENT DOCUMENTS

| | | | |
|---|---|---|---|
| 2,981,827 A | 4/1961 | Orsatti et al. | |
| 4,136,378 A | 1/1979 | Chevali | |
| 4,243,934 A | 1/1981 | Brasfield | |
| 4,423,473 A | 12/1983 | Kirkley | |
| 4,455,562 A | 6/1984 | Dolan et al. | |
| 5,136,483 A | 8/1992 | Schoniger | |
| 5,162,696 A | 11/1992 | Goodrich | |
| 5,175,528 A | 12/1992 | Choi et al. | |
| 5,313,187 A | 5/1994 | Choi et al. | |
| 5,358,880 A | 10/1994 | Lebby | |
| 5,439,941 A * | 8/1995 | Butler et al. ........... 514/690 |

(Continued)

FOREIGN PATENT DOCUMENTS

DE 101 05 622 A1 8/2002

(Continued)

OTHER PUBLICATIONS

"Invitation to Pay Additional Fees" with Annex (Form PCT/ISA/206) mailed by the European Patent Office on Aug. 17, 2005 in PCT Application No. PCT/US2005/008941, 5 pages.

(Continued)

*Primary Examiner*—Sandra O'Shea
*Assistant Examiner*—Jacob Y. Choi
(74) *Attorney, Agent, or Firm*—Haynes and Boone, LLP

(57) ABSTRACT

The present lighting element uses, as a source of light generation, electronically activated light emitting elements, such as light emitting diodes, organic crystals and the like to provide one or more functions and are surface mounted on a flexible substrate, such that the substrate can bend and conform to a pre-established structure. In addition, standoffs of varying lengths are used to provide adjustable distances between the flexible substrate and the housing of the LED light bulb to provide adjustable light dispersion patterns. In this case, the circuit board is adapted to extend about and fit within the interior surface of a light bulb with the light emitting elements carried on the circuit board. A center post can be used to extend electrical conductors to the circuit board from the base and, if required, a power supply can also be carried in the post. A portion of the circuit board itself could also effectively operate as the post. Methods for making same are also provided.

33 Claims, 4 Drawing Sheets

U.S. PATENT DOCUMENTS

| | | |
|---|---|---|
| 5,585,783 A | 12/1996 | Hall |
| 5,707,132 A | 1/1998 | Ooki et al. |
| 5,749,646 A | 5/1998 | Brittell |
| D395,092 S | 6/1998 | Vakil |
| 5,782,553 A | 7/1998 | McDermott |
| 5,877,863 A | 3/1999 | Ross et al. |
| 5,929,788 A | 7/1999 | Vukosic |
| 6,016,038 A | 1/2000 | Mueller et al. |
| D427,335 S | 6/2000 | Noll |
| 6,150,771 A | 11/2000 | Perry |
| 6,150,774 A | 11/2000 | Mueller |
| 6,166,496 A | 12/2000 | Lys |
| 6,211,626 B1 | 4/2001 | Lys |
| 6,220,722 B1* | 4/2001 | Begemann ............... 362/231 |
| 6,227,679 B1 | 5/2001 | Zhang |
| 6,285,119 B1 | 9/2001 | Sundhar |
| 6,286,969 B1 | 9/2001 | Kurokawa et al. |
| 6,293,684 B1 | 9/2001 | Riblett |
| 6,345,903 B1 | 2/2002 | Koike |
| 6,369,781 B1 | 4/2002 | Hashimoto et al. |
| 6,371,636 B1 | 4/2002 | Wesson |
| 6,489,937 B1 | 12/2002 | Ruvinsky |
| D470,606 S | 2/2003 | Bobel |
| D470,608 S | 2/2003 | Bobel |
| D470,610 S | 2/2003 | Bobel |
| 6,523,978 B1* | 2/2003 | Huang ..................... 362/252 |
| 6,548,967 B1 | 4/2003 | Dowling |
| 6,580,228 B1* | 6/2003 | Chen et al. ............. 315/185 R |
| 6,600,274 B1 | 7/2003 | Hughes |
| 6,608,453 B1 | 8/2003 | Morgan |
| 6,621,222 B1 | 9/2003 | Hong |
| D482,143 S | 11/2003 | Buschmann et al. |
| 6,659,632 B1* | 12/2003 | Chen ........................ 362/545 |
| 6,662,489 B1* | 12/2003 | Spiro et al. ................. 43/107 |
| 6,674,096 B1 | 1/2004 | Sommers |
| 6,683,419 B1 | 1/2004 | Kriparos |
| 6,697,130 B1 | 2/2004 | Weindorf |
| D487,940 S | 3/2004 | Buschmann et al. |
| 6,707,247 B1 | 3/2004 | Murano |
| 6,709,126 B1 | 3/2004 | Leen |
| 6,709,132 B1* | 3/2004 | Ishibashi ................... 362/249 |
| 6,724,156 B1 | 4/2004 | Fregoso |
| D490,919 S | 6/2004 | Wiesmeth |
| D491,301 S | 6/2004 | Chen |
| D493,007 S | 7/2004 | Rugendyke et al. |
| D498,310 S | 11/2004 | Gagnon et al. |
| 6,822,397 B1 | 11/2004 | Kawasaki et al. |
| D500,872 S | 1/2005 | Foo |
| D501,055 S | 1/2005 | Packard |
| 6,840,003 B1* | 1/2005 | Moore ......................... 43/113 |
| 6,900,781 B1 | 5/2005 | Mori et al. |
| D508,575 S | 8/2005 | Buschmann et al. |
| 2001/0024112 A1 | 9/2001 | Jacobs et al. |
| 2001/0055353 A1 | 12/2001 | Rybicki et al. |
| 2002/0187570 A1 | 12/2002 | Fukasawa |
| 2003/0031015 A1 | 2/2003 | Ishibashi |
| 2003/0072145 A1 | 4/2003 | Nolan et al. |
| 2003/0090910 A1 | 5/2003 | Chen |
| 2003/0117803 A1 | 6/2003 | Chen |
| 2004/0037080 A1 | 2/2004 | Luk et al. |
| 2005/0007304 A1 | 1/2005 | Gallagher et al. |
| 2005/0174769 A1* | 8/2005 | Yong et al. ............... 362/235 |

FOREIGN PATENT DOCUMENTS

| | | |
|---|---|---|
| EP | 0 441 965 A1 | 8/1991 |
| EP | 0 939 429 A1 | 9/1999 |
| FR | 2 586 844 | 3/1987 |
| JP | 10-305453 | 11/1998 |
| JP | 2001 243807 | 9/2001 |
| JP | 2001 325809 | 11/2001 |
| WO | WO 03/034458 A2 | 4/2003 |
| WO | WO 2004/003869 | 1/2004 |

OTHER PUBLICATIONS

Fredric S. Maxik and Addy S. Widjaja, U.S. Appl. No. 29/235,139, filed Jul. 27, 2005 for "LED Light Bulb".

Fredric S. Maxik and Addy S. Widjaja, U.S. Appl. No. 29/235,140, filed Jul. 27, 2005 for "LED Light Bulb".

Fredric S. Maxik, U.S. Appl. No. 29/235,514, filed Aug. 2, 2005 for "LED Light Bulb".

Fredric S. Maxik, U.S Appl. No. 60/554,469 filed Mar. 18, 2004 for "Lightbulb Using Electronically Activated Light Emitting Elements and Method of Making Same".

Fredric S. Maxik, U.S Appl. No. 60/565,268 filed Apr. 23, 2004 for "Electronic Light Generating Element Lightbulb".

Fredric S. Maxik, U.S Appl. No. 60/567,082 filed Apr. 30, 2004 for "Wide Angle Light Dispersion Electronically Activated Lightbulb and Method of Making Same".

Fredric S. Maxik, U.S Appl. No. 60/567,226 filed Apr. 30, 2004 for "Lightbulb Using Electronic Light Generating Sources".

Fredric S. Maxik and Catherina G.M. Friderici, U.S Appl. No. 29/224,334 filed Feb. 28, 2005 for "Flashlight".

Fredric S. Maxik and Catherina G.M. Friderici, U.S Appl. No. 29/224,333 filed Feb. 28, 2005 for "Floodlight".

Fredric S. Maxik, U.S Appl. No. 10/915,137 filed Aug. 9, 2004 for "System and Method for Providing Multi-Functional Lighting Using High-Efficiency Lighting Elements in an Environment".

Fredric S. Maxik, U.S. Appl. No. 10/915,138 filed Aug. 9, 2004 for "Light Bulb Having Surfaces for Reflecting Light Produced by Electronic Light Generating Sources".

Fredric S. Maxik, U.S. Appl. No. 10/915,301 filed Aug. 9, 2004 for "Light Bulb Having Wide Angle Light Dispersion and Method of Making Same".

Fredric S. Maxik, U.S. Appl. No. 10/915,531 filed Aug. 9, 2004 for "Electronic Light Generating Element Light Bulb".

Fredric S. Maxik, U.S. Appl. No. 29/214,892 filed Oct. 8, 2004 for "LED Light Bulb".

Fredric S. Maxik, U.S. Appl. No. 10/214,893 filed Oct. 8, 2004 for "LED Light Bulb".

Fredric S. Maxik, U.S. Appl. No. 29/243,097 filed Nov. 18, 2005 for "LED Light Bulb".

PCT Search Report (PCT/ISA/220 and 210) and Written Opinion (PCT/ISA/237) dated Nov. 25, 2005 for PCT Application No. PCT/US2005/008941, 15 pages.

* cited by examiner

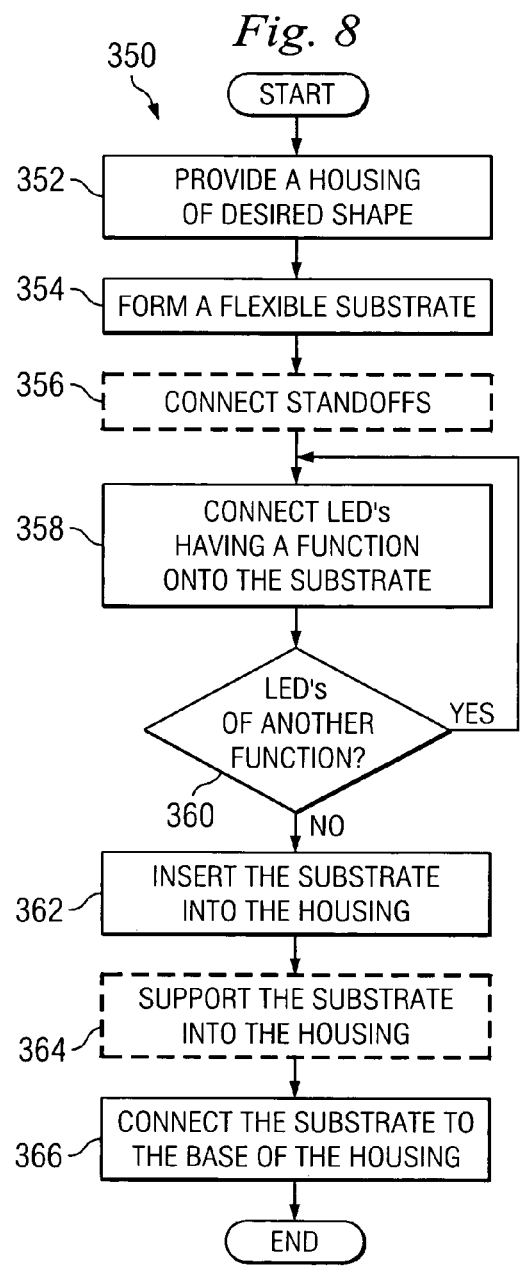
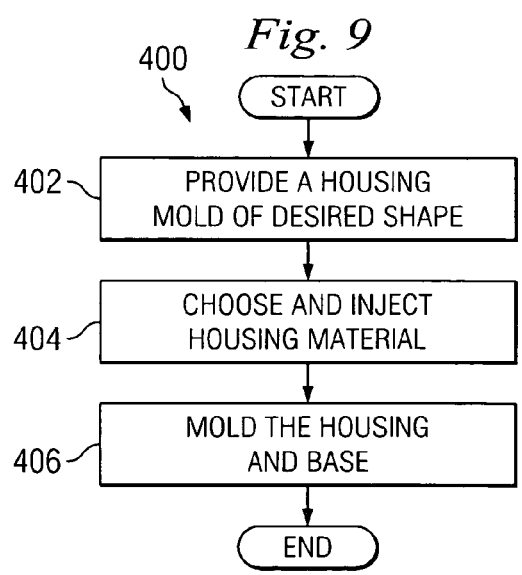

LIGHTING ELEMENT USING ELECTRONICALLY ACTIVATED LIGHT EMITTING ELEMENTS AND METHOD OF MAKING SAME

CROSS REFERENCE TO RELATED APPLICATIONS

This application is based on U.S. Provisional Application No. 60/554,469 entitled Lighting Element Using Electronically Activated Light Emitting Elements and Method of Making Same filed on 18 Mar. 2004. The benefit of the filing date of the Provisional Application is claimed for this application. The entire contents of the Provisional Application are incorporated herein by reference.

FIELD OF THE INVENTION

The present invention relates to light bulbs. More specifically, the invention relates to a lighting element for use in light bulbs. The lighting element is comprised of light emitting diodes (LED's) which are mounted on a flexible form which can be configured into various shapes for greater light dispersion and functionality.

PROBLEM

In recent years, there have been significant improvements in electronically activated elements for generating light. Light emitting diodes are well-known and have been used for many years. However, light emitting diodes, as well as the other light emitting elements, generally provide a very directional source of light. As a result, they are not readily adaptable for providing the necessary degree of dispersion and wide light reflectivity which is normally desirable in light bulbs. In fact, most people desire a light source to provide light omni-directionally, much in the same manner as an incandescent light bulb.

Another problem is that present designs of LED light bulbs require a post or support that connects the flexible circuit board at two contact points, thus generally forming a cage. This cage does not provide a flexible design or arrangement of LED's inside the light bulb due to it's inherent design which generally produces a globe shape. This connection arrangement between the support and the flexible substrate does not allow the flexible substrate to be designed for shapes other than a globe shape. In addition, manufacturing costs associated with this type of design are high because the unit must be essentially hand built. Higher manufacturing costs are also incurred due to the fact that these types of designs use LED's with a lens on each LED because of the arrangement of the LED relative to the outer housing. Further, many of the LED's in this arrangement are ultimately pointed towards the base of the light bulb which wastes light which is transmitted inward toward the base instead of emitting it outward.

Another problem is that present designs of LED light bulbs are limited, essentially to the conventional incandescent light bulb shape commonly used. However, shapes and uses for specialized purposes, such as lighting an alcove corner or down-lighting a wall or wall washes using LED light bulbs are not presently known. The shape of the present day LED light bulbs is also limited by the fact that the LED's include a lens which has an effect on the packing and arrangement possibilities of the LED's in any given circumstance.

Further, present LED light bulb designs do not contemplate multiple functional uses of the LED light bulbs to accommodate a customer's needs. Typically, commonly known LED light bulbs are exclusively directed toward providing light in a single environment and the apparatus used to implement the LED light bulb cannot be used in other applications.

Information relevant to attempts to address these problems can be found in U.S. Pat. No. 6,709,132 issued Mar. 23, 2004 to Ishibashi; U.S. Pat. No. 5,585,783 issued Dec. 17, 1996 to Hall; U.S. Pat. No. 6,709,126 issued Mar. 23, 2004 to Leen; U.S. Pat. No. 6,697,130 issued Feb. 24, 2004 to Weindorf et al.; and U.S. Pat. No. 6,227,679 issued May 8, 2001 to Zhang et al. However, each one of these references suffers from one or more of the following disadvantages: lack of functionality and limited light dispersion properties.

Heretofore, there has not been any effective commercially available construction which allows for wide distribution of light in a light bulb constructed in such manner so as to avoid the universal point source of light. The point source of light from these various electronic light emitting elements cannot be changed due to the nature of the physical principles of operation thereof. However, there still is a need for a light bulb using electronically activated light emitting elements and which provides, in combination, a wide degree of light dispersion as well as a method of making same.

SOLUTION

The present lighting element relates in general terms to an LED light bulb which uses electronically activated light emitting elements to generate individual sources of light. The individual sources of light are arranged in such manner that the LED light bulb in which the elements are used provides a wide degree of light dispersion to completely avoid the point source of light emission from the light bulb itself.

The light bulb of the present invention uses an outer bulb housing which may be pre-formed with either a glass or a generally transparent or light translucent composition. This light bulb housing has the same general form as light bulb housings normally used with Edison style bases, that is somewhat of a globe configuration with a tapered neck to fit into the Edison style base. Further, additional forms of light bulbs can be accommodated by the present lighting element. Specifically, the present lighting element is bendable to fit generally any form of light bulb housing, such as a dome shape like a conventional light bulb, a flood or spot light shape, a vanity light bulb shape, or a tube shape to mimic fluorescent shapes or other fanciful shapes such as those commonly seen in the neon lights industry. In addition to these unique forms, a benefit from the specific light dispersion thereby is also provided.

Mounted within the housing and generally fitted against the interior surface of the housing is a flexible circuit board. Physically mounted on the circuit board are individual light emitting elements or other electronically activated light generating elements. The circuit board is cut into a configuration where it is provided with a central dome and a plurality of outwardly and downwardly extending fingers. The dome and fingers of the circuit board carry on their outwardly presented surface the individual light emitting elements.

The present lighting element further provides flexibility of lighting arrangements in that a standoff of a predetermined size is used in between each LED or in between every other LED. The standoffs provide an adjustable distance between the LED and the outer housing of the present invention. Standoffs of varying size are used to create a light bulb that provides differing light dispersion patterns according to number and size of the standoffs used in a particular application. This flexibility allows for the manufacturing of LED light bulbs that provide varying and predetermined light dispersion patterns based on the number and size of standoffs used during manufacturing.

Different types of LED's are employed to provide a multi-functional approach to the LED light bulb. Specifically, non-visible wavelength light LED's may be used, in addition to visible wavelength light LED's, to provide an additional functional aspect to the LED light bulb, such as bacteriological sterilization or disinfection. Further sensors are incorporated into the LED light bulb to provide additional functionality regarding when the LED's are fully or partially powered.

The LED's can also be lensless LED's, which provide additional flexibility to shaping and arranging these LED's into desirable forms. Since lensless LED's provide a greater angle of dispersion, using them with the present lighting element provides additional flexibility and dispersion of the light. The housing of the present lighting element provides an exoskeleton for the lensless LED's, which can be shaped into generally any desirable shape or form. Again, utilizing standoffs in a particular fashion to provide a distance between the lensless LED's and the housing provides increased light dispersion and flexibility for applications for the LED light bulb.

In some cases, it is also possible to eliminate that center post and employ an elongated leaf in its place. This elongated leaf or finger could easily carry the electrical leads from the base to the circuit board and particularly the hub of the circuit board. In this way, it is possible to completely eliminate the need for a post. If a post is used, it would be adapted for snap fitting engagement with the circuit board when the latter is bent to conform to the interior surface of the light bulb.

There is also provided, as hereinafter described, a method of making the light bulbs which is highly efficient and requires only a minimal amount of manual labor.

This present lighting element thereby provides a unique and novel LED light bulb using electronically activated light emitting elements and method of making same, which thereby fulfills all of the above-identified objects and other objects which will become more fully apparent from the consideration of the forms in which it may be embodied. One of these forms is more fully illustrated in the accompanying drawings and described in the following detailed description of the invention. However, it should be understood that the accompanying drawings and this detailed description are set forth only for purposes of illustrating the general principles of the invention.

These and other features, aspects, and advantages of the present lighting element will become better understood with regard to the following description, appended claims, and accompanying drawings.

BRIEF DESCRIPTION OF THE DRAWINGS

FIG. 8 illustrates in block flow diagram form a process for making a LED light bulb; and FIG. 9 illustrates in block flow diagram form a process for making a housing for a LED light bulb.

DETAILED DESCRIPTION OF THE DRAWINGS

Figure 1:
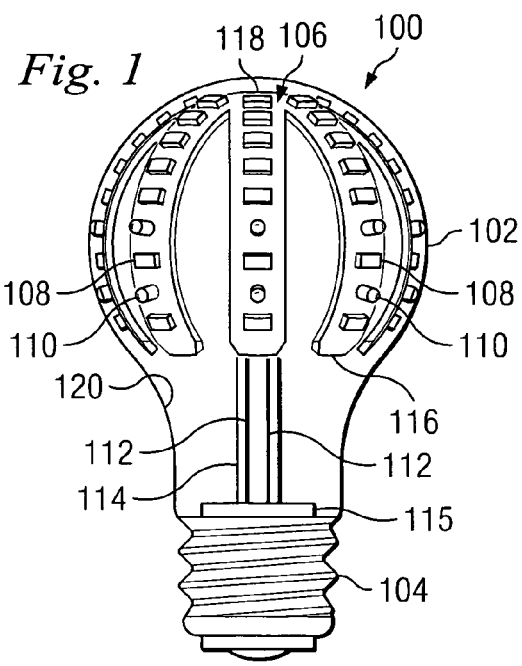
FIG. 1 illustrates a side elevation view showing a portion of the interior of the LED light bulb with a formed substrate with light emitting elements mounted thereon.

Referring to FIG. 1, the present LED light bulb 100 comprises a housing 102 with a base 104 connected thereto. The housing 102 can be in the form of a standard incandescent light bulb housing, or any other desirable form or shape and includes an inside wall 120. The base 104 normally adopts the form of a conventional Edison base, although any base could be used. The housing 102 of the LED light bulb 100 is transparent or at least light translucent. Light is provided by a plurality of light emitting elements 108 that are connected to a formed substrate 106 that contours to the form of the inside wall 120 of the housing 102. The dispersion of the light emitted from the light emitting elements 108 can be adjusted by adjusting the distance between the light emitting elements 108 and the inside wall 120 of the housing 102. To facilitate the adjustable spacing of light emitting elements 108, standoffs 110 are interposed between the inside wall 120 of the housing 102 and the formed substrate 106.

Figure 2:
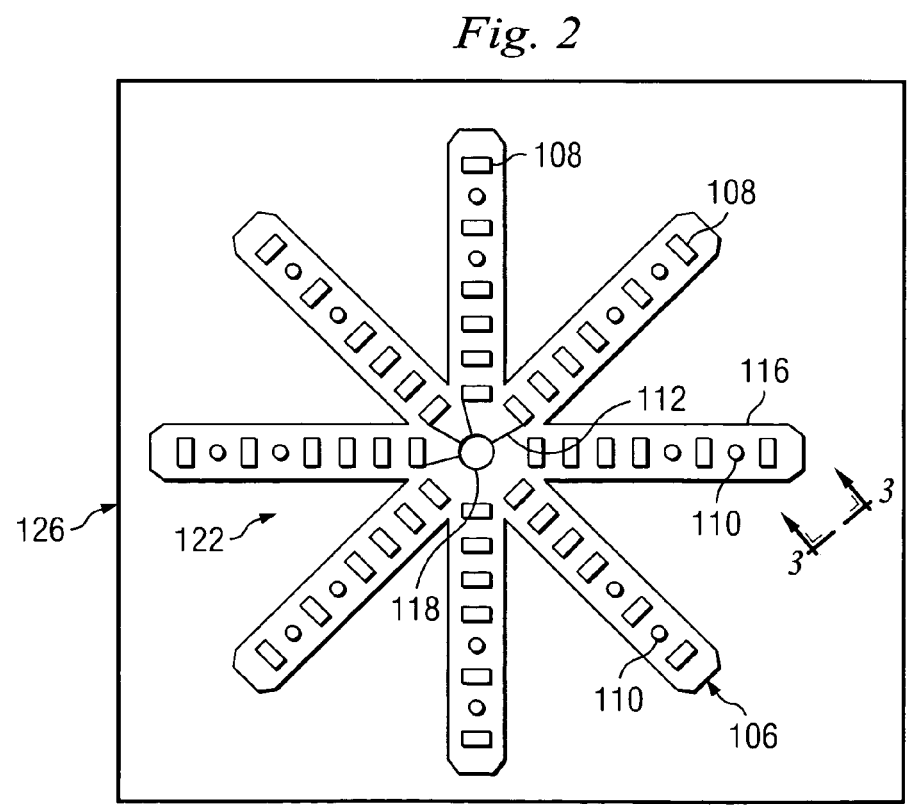
FIG. 2 illustrates a top elevation view of a pattern of a formed substrate which can be formed from a sheet of circuit board material and used in the LED light bulb.

The formed substrate 106 may be held in place within the housing by a support 114 which can be connect to the base 104 or elsewhere on the housing to provide support for the formed substrate 106. In particular, it can be observed that the formed substrate 106 is provided with a somewhat centrally hub connector 118 located at the formed substrate 106 for connecting with the support 114. Electrical power is provided to the light emitting elements 108 via electrical connectors 112 which connect to each light emitting element 108 and to the base 104. In order to provide power to the light emitting elements 108 which are mounted on the formed substrate 106, there is provided, in one aspect of the invention, the support 114 which may be suitably connected to the base 104 in such manner that the electrical connectors 112 extending upwardly through the support 114 can provide electrical current to the formed substrate 106 and the light emitting elements 108. The pre-formed formed substrate 106 configuration as shown in FIG. 2 can then be mounted to the upper end of the support 114, typically by a connector 118, such as a type of snap fitting arrangement, or merely have an opening to receive the upper end of the support 114. Control circuitry 115 is interposed between said base 104 and said light emitting elements 108 and can be located substantially in the base 104 as depicted in FIG. 1, or elsewhere such as on the underside of the formed substrate 106 near the hub connector 118. Electricity supplied to these electrical connectors 112 can be AC or DC, in the case of AC the necessary control circuitry 115 may be located for converting the AC power to DC power is used. This control circuitry 115 may include resistors, rectifying diodes, and Zener diodes. Rectifying diodes convert AC to DC, should the power source to the LED's be AC. Rectifying diodes are not needed when the power supply is DC. Control circuitry 115 further includes the necessary circuitry for operating sensors and the like as described herein.

In one aspect of the LED light bulb, the housing 102 is filled dry air or an inert gas, such as nitrogen, to prevent moisture or dust from entering the inside of the housing 102. In addition, when lensless LED's are used in the LED light bulb, the gas inside the housing must be particularly dry and inert to as to prevent damage to the LED chips.

Figure 3:
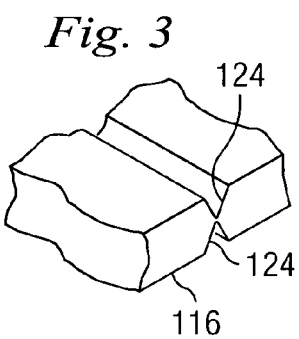
FIG. 3 illustrates a side elevation view of the score lines in the substrate that form the outline of the formed substrate in FIG. 2.
Figure 5:
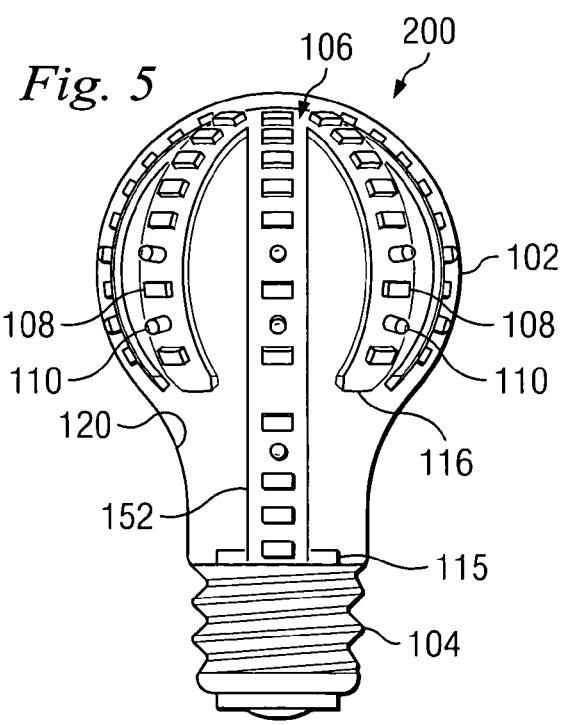
FIG. 5 illustrates a side elevation view showing a portion of the interior of the LED light bulb with another formed substrate with light emitting elements mounted thereon.

Referring to FIG. 2, it can be observed that the formed substrate 106 is actually cut or pressed out from a substrate 126 of circuit board material. The formed substrate 106 is cut in such fashion that it is provided with a plurality of individual finger-like projections 116 and each of which further carry light emitting elements 108 or other light generating elements thereon, in addition to standoffs 110. Moreover, it can be observed that there are individual recesses 122 between each of the finger-like projections 116. In this way, the various finger-like projections 116 can be located in close relationship to one another in the manner as shown in FIGS. 1 and 5 of the drawings. The recesses 122 are designed to allow the finger-like projections 116 and the elongated projections 152 to form near or adjacent to each other when inserted into the housing 102. Referring to FIG. 3, the formed substrate 106 may be provided with perforations or score lines 124, or the like, having the configuration of the formed substrate 106 when inserted into the housing 102 of the LED light bulb 100.

Figure 4:
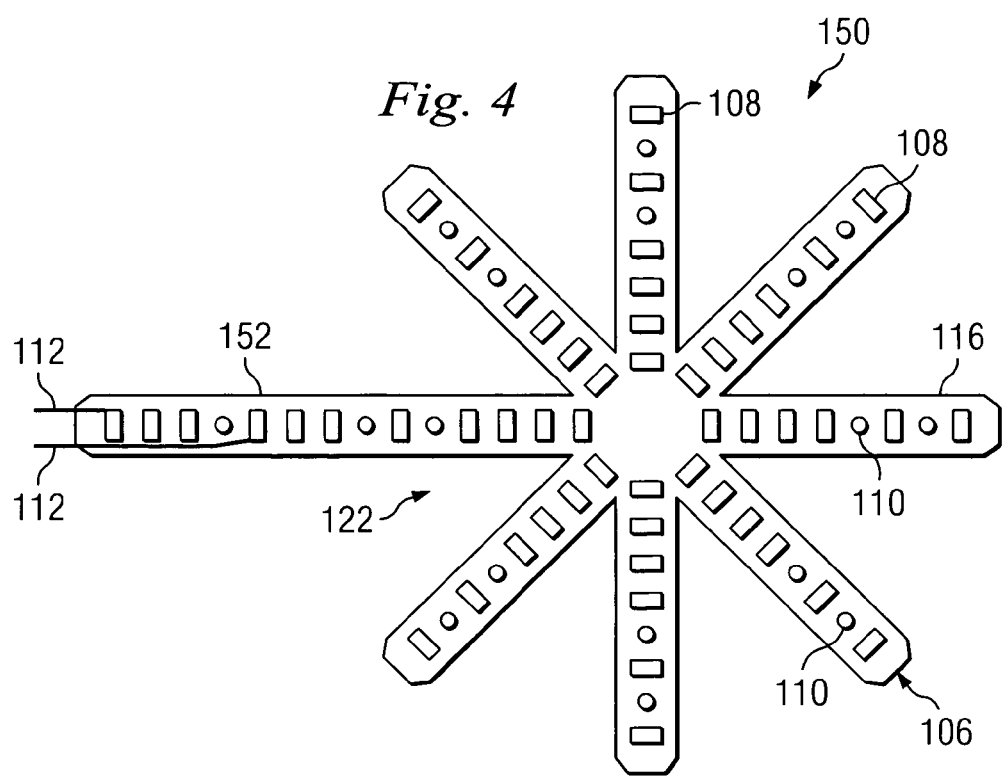
FIG. 4 illustrates a top view elevation of another pattern of a substrate including an elongated portion of the formed substrate.

FIG. 4 illustrates another embodiment 150 of a formed substrate 106 which can be used in the LED light bulb 100 of the present invention. This embodiment has a plurality of finger-like projections 116. Generally, each of the finger-like projections has the same general size and form except that one or more of the finger-like projections 116 is an elongated projection 152, which has a length substantially longer than the other finger-like projections 116. Again, each of the finger-like projections 116 and elongated projections 152 would be separated by recesses 122. The elongated projection 152 has a length slightly longer than the length of the post 26. In this way and inasmuch as the formed substrate 106 would be adapted to fit within the housing of the LED light bulb 100, the elongated projection 152 could be effective for carrying the electrical connectors 112 to the center of the connector 118 or any other portion of the formed substrate 106 to supply power to the light emitting elements 108 formed therein. Little or no rigidity would be required in the elongated projection 152 inasmuch as its form is determined by the interior surface or inside wall 120 of the housing 102 and it will effectively remain in and conform to that inside wall 120 of the housing 102.

When the formed substrate 106 is disposed within the housing 102, it can be seen that light emitting elements 108 are located over almost the entire surface area of the inside wall 120 of the housing 102. In this way, even though the individual light emitting elements 108 may only emit light within an arc of 10 to 15 degrees, due to the fact that the light emitting elements 108 are disposed almost entirely over the inside wall 120 of the housing 102, light will appear as though it is almost coming from a 360 degree source.

FIG. 5 illustrates another embodiment 200 of the LED light bulb, which includes embodiment 150 of the formed substrate 106. It can be seen that the elongated projection 152 of the embodiment 150 of the formed substrate 106 comes into contact with the base 104 when the formed substrate 106 is entirely disposed within the housing of the LED light bulb 200.

Figure 6A:
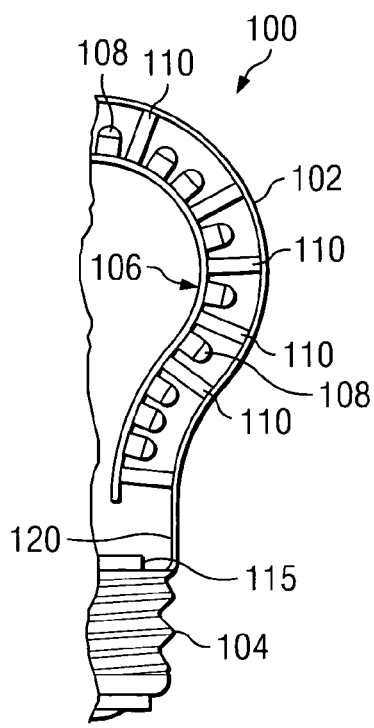
FIG. 6A illustrates a cross-section view of a LED light bulb with light emitting elements spaced a distance from the housing by standoffs.
Figure 6B:
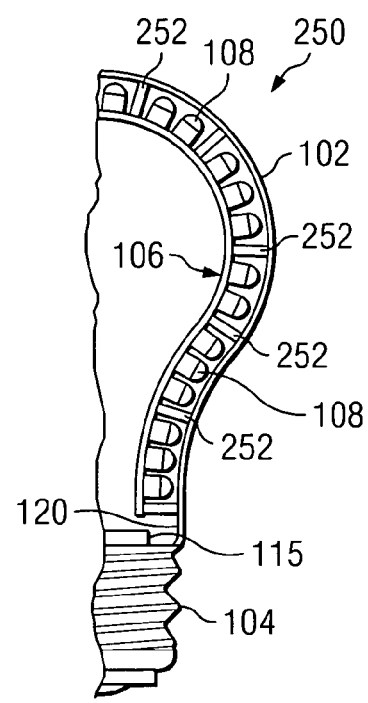
FIG. 6B illustrates a cross-section view of a LED light bulb with light emitting elements spaced a lesser distance from the housing by standoffs.

FIG. 6A illustrates a cross-section view of embodiment 100 of the LED light bulb. A plurality of light emitting elements 108 are shown interspersed among a plurality of standoffs 110. The standoffs 110 provide function as a spacer between the inside wall 120 of the housing 102 and the formed substrate 106. This spacing is adjustable by using different lengths of standoffs 110 to provide a greater or a lesser distance between the inside wall 120 and the formed substrate 106. As the distance between the inside wall 120 and the formed substrate are changed, correspondingly so too is the light path distance between the light emitting elements 108 and the housing 102, which changes the dispersion pattern of the light emitted through the housing 102 by the light emitting elements 108. FIG. 6B, illustrates a cross-section view of another embodiment 250 of the LED light bulb having standoffs 252 of shorter length are provided which can be seen to decrease the distance between the inside wall 120 and the light emitting elements 108. In addition to the light emitting elements 108 described above, lensless light emitting elements may also be used with the LED light bulb.

Figure 7:
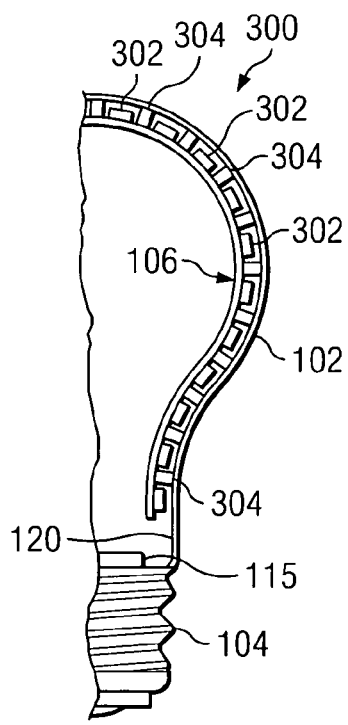
FIG. 7 illustrates a cross-section view of a LED light bulb with lensless light emitting elements spaced a distance from the housing by standoffs.

FIG. 7 illustrates a cross-section view of another embodiment 300 of the LED light bulb having standoffs 304 and lensless light emitting elements 302. In this embodiment, the lenses from common light emitting elements are removed so as to provide additional flexibility to the light dispersion qualities of the LED light bulb 300.

Figure 7A:
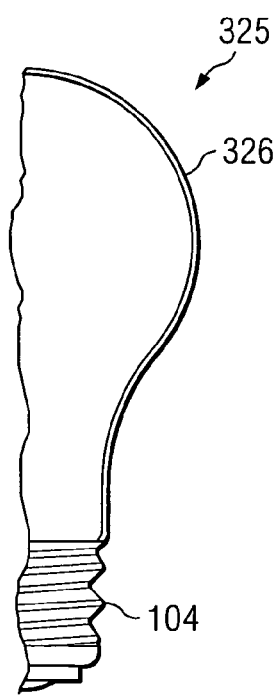
FIG. 7A illustrates a cross-section view of a LED light bulb having a thin film applied to the housing.

The housing 102 can manufactured to generally any desired form. The housing material can be any material suitable for the purposes of molding or forming the housing 102 to the desired forms, such as round or half forms, donut forms, and forms of present day neon lighting. The housing 102 is made from a moldable material that is transparent, semi-transparent, and/or translucent. Such materials may include polymers, copolymers, or other moldable materials, such as polycarbonates, plastics, or the like. In addition, the housing 102 or portions of the housing 102 can be manufactured with a certain form, shape, pattern, or the like to change the light dispersion pattern emitted from the light emitting elements 108. For example, during the manufacturing of the housing 102, a specific die or tool to shape or form the housing 102 in a particular way to achieve a certain effect of the light passing through the housing 102. These dies or tools affect the imprint, shape, or form of the housing 102 or the surface, internally or externally, of the housing 102. Referring to FIG. 7A, a LED light bulb 325 is shown depicting an optional thin film 326 that can be applied to LED light bulbs 100, 200, 250, and 300. LED light bulb 325 is depicted without any internal elements, such as formed substrate 106. In addition, the thin finish 326 may be created on the housing 102 to provide a different light dispersion pattern provided by the LED light bulb 100, 200, 250, and 300. The thin film 326 can also be applied to the housing 102 for providing a different light dispersion pattern from the LED light bulb 100, 200, 250, and 300. In another aspect of the present lighting element, a pattern is etched, scratched, or polished in the housing 102 to provide yet another light dispersion pattern from the LED light bulb 100, 200, 250, and 300. In yet another aspect of the present lighting element, a grit pattern is included in the mold for the housing to provide a further micro-optic pattern in the finished lens portion of the housing 102 when molding the LED light bulb 100, 200, 250, and 300. The housing 102 can be molded as one piece or several pieces and later assembled together using an adhesive or other fixture means.

The light emitting elements 108 are generally light emitting diodes (LED's), but may be other types of diode lights, such as laser diodes and wide band gap LED's. Generally, these typical LED's are normally constructed using standard AlInGaN or AlInGaP processes and include a LED chip or die mounted to a reflective metal dish or reflector that is generally filled with a transparent or semi-transparent epoxy, thus encapsulating the LED chip. The epoxy or encapsulant serves the purposes of reducing the total internal reflection losses and sealing the LED chip or die. Lensless LED's have the encapsulant removed from the reflective metal dish, thus exposing the diode. The present LED light bulb provides use of both of these types of LED's. The LED's used in the present LED light bulb provide a wide functional coverage according to the specific LED's employed with the LED light bulb.

Any color of LED's can be used with the present LED light bulb, colored LED's such as red (R), blue (B), and green (G) can be use in addition to white (W) with the present LED light bulb to accommodate the desires of the user. For example, mood lighting can be achieved by combining the desired colored LED's together in the LED light bulb. The end desired light product can be achieved by using the RGBW LED's to accomplish the desired lighting. By way of illustration, if a 3,700 Kelvin color is desired, the mix of the LED's would be 50 red, 27 green, and 23 blue to achieve this color. In this aspect of the LED light bulb, a designed housing 102 incorporating the proper micro-optics, such as finishes or thin films, mixes the color to provide the desired end product. The number, arrangement, and color selection of the LED's on the formed substrate 106 creates a flexible LED light bulb that can meet the desired lighting requirements of a given situation.

The LED's can be color shifted as well to increase the flexibility of the end product LED light bulb. The color can be adjusted as well to add greater flexibility. Generally, any number and color of LED's can be used to provide the desired lighting requirements. By way of example, a department store may desire to have more of a full-spectrum lighting arrangement for its cosmetic counters. In this example, several different LED's are used to provide a light with a fuller spectrum with optimal color rendering than may be needed for lighting a hallway or other room in a building. In addition to the lighting function provided by the LED light bulb, other functions can be provided by the LED light bulb, either independently or in concert with the lighting function.

For example, some of the LED's used in a light bulb may emit light of a visible wavelength and others may emit light of a non-visible or invisible wavelength. A LED light bulb containing LED's emitting a visible wavelength light and LED's emitting a non-visible wavelength light provides different functions, for example lighting and bacterial disinfection. Further, the position of these different LED's relative to the housing is also important. For instance, a plurality of LED's that emit non-visible ultraviolet wavelength light, capable of bacterial disinfection or sterilization, may be positioned relative to the housing such that when operated, these LED's are aimed or pointed toward a countertop or surface intended to be disinfected or sterilized. It is also apparent, that because the LEDs are positioned within the housing according to their function, that safe use in occupied environments is also provided. Thus, UV wavelength light provided by some of the LED's is pointed directly and only towards the countertop or other surface and not on or towards occupants of the room. In addition, where the visible wavelength LED's are used for lighting a room, then the location of these LED's relative to the housing will be oriented within the housing accordingly so. Other functions of the non-visible wavelength LED's include biological uses such as attracting insects, repelling insects, attracting fish, producing ozone or ultraviolet light for ridding air contamination and pollution.

In another aspect of the LED light bulb, electrical sensors are placed within the housing with the LED's to provide additional functionality to the LED light bulb. For example, a motion sensor is placed in the housing and in the absence of detectable motion, the LED's are driven by a small amount of power, such as one half watt, but when motion is detected by the motion sensors, then the LED's may be driven to full power, such as two and a half watts. In this example, all of the LED's may be cycled between one half watts and two and a half watts. In another example, a portion of the LED's in the LED light bulb may be energized at any given time and the remaining LED's are not energized, and when motion is detected by the motion sensors, then the remaining LED's are energized to provide more light. In yet another example, the LED light bulb may provide a marker light dimly illuminating a pathway, but when the motion sensors detect motion, then the LED light bulb may provide full power to the LED's and light the pathway fully. Additional sensors include are contemplated with the present LED light bulb, such as photo sensors, sound sensors, and the like.

One of the features of the above described device are the use of standoffs 110 interposed between formed substrate 106 and the inside wall 120 of the housing 102 to adjust the dispersion of light provided by the LED light bulb 100, 200, 250, and 300. Standoffs 110 are used to provide flexibility to the functionality of the LED light bulb 100, 200, 250, and 300. Many different lighting environments or scenarios are achieved by this flexibility of adjusting the distance between the light emitting elements 108 and the lensless light emitting elements 302 and the inside wall 120 of the housing 102. For example, if a wall wash light dispersion pattern is needed in a room, a standoff 110 of a certain size may be used between a plurality of lensless light emitting elements 302 to achieve the desired lighting effect. Varying the size or length of the standoffs 110 varies the distance between the light emitting elements 108 and lensless light emitting elements 302 and the housing 102, which varies the light dispersion pattern emitted from the LED light bulb. In some instances, standoffs 110 may not be used. For example, if the desired light dispersion pattern is a flood-type pattern, then standoffs 110 may not be used so that the lensless light emitting elements 302 are adjacent to the inside wall 120 of the housing 102, thus creating a light dispersion pattern of a flood-type light.

The size or length of the standoff 110 may also be varied according to the type or color of light that is emitted from the light emitting elements 108 and the lensless light emitting elements 302 in the proximity of the standoff 110. Different wavelengths of light emitting elements 108 and the lensless light emitting elements 302 may require different sized standoffs 110 to provide the desired disperse light. The standoffs 110 are also a function of the ultimate desired dispersion of light provided by the LED's.

Standoffs 110 may also be provided in a roll so that they can be placed down by automated machinery. In one aspect of the present lighting element, the standoffs 110 are made out of similar material as the LED casings. Standoffs 110 may also be made out of any suitable rigid or semi-rigid material, such as plastics, polymers, or copolymers that provide the necessary function of the standoff 110. A variation of standoffs 110 include providing a formed substrate 106 that includes relief spots or bumps (not shown) that provide a spacing means interposed between the formed substrate 106 and the inside wall 120 of the housing 102 for adjusting the light dispersion pattern from the LED light bulb 100, 200, 250, and 300.

The substrate 126 can be any material that supports the function of holding light emitting elements 108 and lensless light emitting elements 302 in place and providing support for the electrical leads. This material is commonly known in the arts of printed circuit boards and flexible circuit boards. Arrangement of the light emitting elements 108 and lensless light emitting elements 302 on the formed substrate 106 is dependent on the use for the specific LED light bulb 100, 200, 250, and 300. For instance, if many LED light bulb 100, 200, 250, and 300 are placed adjacent or next to each other, then the arrangement of light emitting elements 108 and lensless light emitting elements 302 on the formed substrate 106 would not generally be as far down toward the base 104 of the LED light bulb 100, 200, 250, and 300.

The formed substrate 106 is constructed of flexible material that generally has electrical connectors 112 formed within its layered construction, such as printed circuit board and flexible circuit board material, so that it is capable of being bent to a substantial degree without interfering with the electrical conductivity of all of the light emitting elements 108 and lensless light emitting elements 302 mounted on the surface of the formed substrate 106. The substrate 126 of the present lighting element generally is shaped in rectangular configuration when placed flat on a flat surface. These substrates 126 also generally have a front face and a back face. These substrates 126 generally also contain score lines 124, which comprise of v-shaped scores or cross-sections to allow the substrate 126 to be broken into smaller pieces, shapes, and/or formed substrates 106.

Electricity is supplied to the light emitting elements 108 and lensless light emitting elements 302 via electrical connectors 112 that are formed within the formed substrate 106 and that are connected to the base 104 of the LED light bulb 100, 200, 250, and 300. The electrical connectors 112 can be routed through the support 114 or through an elongated projection 152 of the formed substrate 106. Electricity can be AC or DC, in the case of AC the necessary control circuitry 115 for converting the AC power to DC power is used. This control circuitry 115 may include resistors, rectifying diodes, and Zener diodes. Rectifying diodes convert AC to DC, should the power source to the LED's be AC. Rectifying diodes are not needed when the power supply is DC. This circuitry is generally housed near the base of the LED light bulb 100, 200, 250, and 300.

A support 114 can be used to hold the formed substrate 106 in place within the housing 102 of the LED light bulb 100, 200, 250, and 300. Generally, the support 114 only contacts the formed substrate 106 on one contact point of the formed substrate 106, such as at the connector 118, thereby allowing the formed substrate 106 to conform freely and completely to the housing. In another aspect of the present lighting element, instead of a support 114, an elongated projection 152, leaf or finger of the formed substrate 106 may make contact with the base 104 for providing support and containment for the electrical connectors 112 that power the light emitting elements 108 and lensless light emitting elements 302.

The present lighting element also provides preparation methods for making LED light bulb 100, 200, 250, and 300 for a desired application. This desired application can be formulated by a customer using a catalog and placing an order over a phone or via mail for a particular LED light bulb having one or more functions. In another aspect of the present method, a customer could place their order for a specialized LED light bulb 100, 200, 250, and 300 over the internet via an interactive e-commerce site, where the customer orders individual or sets of LED light bulbs for a particular use or application. The selections provided to the customer allow the customer to choose between the various functions and aspects of LED light bulbs noted above, including those with sensors incorporated therein.

FIG. 8 illustrates a block flow diagram of an exemplary method 350 in accordance with the present lighting element for preparing a LED light bulb 100, 200, 250, and 300. In step 352, a housing 102 is provided generally including a base 104, however, the base 104 at this step may or may not be attached to the housing 102. The housing 102 is formed using a transparent, semi-transparent, or translucent material and is shaped to a desired shape. In addition, the housing 102 may be provided in a single piece or separate pieces to be attached together later in the process by adhesives or other fixture means. The base 104 also generally includes a formed socket a socket piece for inserting into a standard socket, Edison-style or standard electrical socket or connection. Step 358 may also include providing and attaching electrical sensors into the housing 102 as well.

In step 354, a substrate 126 is provided which is stamped or otherwise formed or shaped into the formed substrate 106 shape. Electrical connectors 122 are provided in the formed substrate 106 for connecting with either or both the light emitting elements 108 and the lensless light emitting elements 152 of the present lighting element. In optional step 356, standoffs 110 are chosen and attached to the formed substrate 106 for providing the desired distance between the inside wall 120 of the housing 102 and the formed substrate 106 to achieve the desired light dispersion and effect. If no distance is required to be provided by the standoffs 110, then step 356 may be omitted. In another aspect of the present LED light bulb, a formed substrate 106 having bumps or relief spots already formed on the formed substrate 106, such that standoffs 110 are not required. In yet another aspect of the present LED light bulb, these bumps or relief spots may be formed on the inside wall 120 of the housing 102, such that standoffs 110 are not required.

In step 358, the light emitting elements 108 and lensless light emitting elements 302 are chosen and attached to the formed substrate to achieve the desired functionality of the LED light bulb 100, 200, 250, and 300. Either or both of the light emitting elements 108 and lensless light emitting elements 302 may be chosen to provide the desired functionality of the LED light bulb 100, 200, 250, and 300. The light emitting elements 108 and lensless light emitting elements 302 are attached to the formed substrate 106 so as to make electrical contact with the electrical connectors 122 formed within the formed substrate 106. This attachment may include inserting the light emitting elements 108 and lensless light emitting elements 302 through one side of the formed substrate 106 and making soldering the light emitting elements 108 and lensless light emitting elements 302 to the electrical connectors 122 on the reverse side of the formed substrate 106. In step 360, additional desired light emitting elements 108 and lensless light emitting elements 302 are added to the formed substrate 106. This step may include providing the necessary circuitry for driving the light emitting elements 108 and lensless light emitting elements 302 should AC power be employed.

In step 362, the formed substrate 106 including the attached light emitting elements 108 and lensless light emitting elements 302 are inserted into the housing. This is done so that the formed substrate 106 is disposed within the housing 102 of the LED light bulb 100, 200, 250, and 300. In optional step 364, a support 114 may be desired to assist with keeping the formed substrate 106 in place, this support 114 is then connected to the formed substrate 106. In another aspect of the present method 350, the support 114 may be attached to the formed substrate 106 prior to step 362. Finally, in step 366, the base 104 is connected to the electrical connectors 122 and the base is attached to the housing 102.

The present lighting element also provides preparation methods for making a housing 102 of a LED light bulb 100, 200, 250, and 300.

FIG. 9 illustrates a block flow diagram of an exemplary method 400 in accordance with the present lighting element for preparing a LED light bulb 100, 200, 250, and 300. In step 402, a housing mold is provided for forming a material into a housing 102 of the present LED light bulb 100, 200, 250, and 300. The housing mold may include dies or tools for forming the housing 102 into different patterns, shapes, forms, or finishes to provide a specific lighting effect.

In step 404, a material chosen for molding is injected into the mold such that any effects or finishes provided by the mold are incorporated into the housing 102 when it is formed. In step 406, the housing 102 is molded. As described above, the housing 102 may be formed or molded in one or more pieces and then later assembled with adhesives or other fixture means. The base 104 may be molded in a similar fashion or by other means than provided for forming the housing 102.

Although there has been described what is at present considered to be the preferred embodiments of the present lighting element, it is understood that the lighting element can be embodied in other specific forms without departing from the spirit or essential characteristics thereof. For example, different LED elements may be considered that are covered under the general forms herein described. The present embodiments are, therefore, to be considered in all aspects as illustrative and not restrictive. The scope of the invention is indicated by the appended claims rather than the foregoing description.

What is claimed:

1. A lighting element, comprising:
   a housing having a base and a form, which housing has an inside wall;
   a substrate including electrical conductors in connection with said base and conforming substantially to said inside wall;
   a plurality of light emitting devices located on said substrate in electrical connection with said substrate; and
   at least one standoff interposed between said substrate and a portion of said housing for providing a distance between said substrate and said portion of said housing.

2. The lighting element of claim 1 wherein each said light emitting device is a light emitting diode.

3. The lighting element of claim 2 wherein each said light emitting device produces a visible wavelength light.

4. The lighting element of claim 2 wherein each said light emitting device produces a non-visible wavelength light.

5. The lighting element of claim 2 wherein said light emitting diode is a lensless light emitting diode.

6. The lighting element of claim 1 wherein said form is predetermined for a use for said lighting element.

7. The lighting element of claim 1 wherein said housing includes: an optical tuning element substantially interposed between at least one of said light emitting devices and a portion of said housing.

8. The lighting element of claim 1 wherein said substrate further comprises: a substantially planar form such that when inserted into said housing said substantially planar form enables said substrate to conform to said inside wall.

9. The lighting element of claim 8 wherein said substantially planar form comprises a center portion with at least one finger-like extension extending outwardly and radially from said center portion, such that when said substantially planar form is inserted into said housing said at least one finger-like extension conforms substantially to the form of said housing.

10. The lighting element of claim 1 wherein said housing further comprises: a support connected to said substrate and said base for supporting said substrate in said housing in a desired position, said support being in contact with said substrate at only one contact point.

11. The lighting element of claim 10 wherein said support contains said electrical conductors connecting said base with said substrate.

12. The lighting element of claim 1 wherein said substrate comprises a flexible circuit board.

13. The lighting element of claim 1 wherein a first portion of said plurality of light emitting elements provides a first function said light emitting elements of said first portion being oriented relative to said housing means to optimize said first function.

14. The lighting element of claim 13 wherein a second portion of said plurality of light emitting elements different from said first portion provides a second function, said light emitting elements of said second portion being oriented relative to said housing means to optimize said second function.

15. The lighting element of claim 14 wherein said first function is lighting.

16. The lighting element of claim 14 wherein said second function is selected from the group consisting of bacteriological control, insect control, pest control, and pollution control.

17. The lighting element of claim 14 wherein said light emitting elements of said first portion are light emitting diodes.

18. The lighting element of claim 14 wherein said light emitting elements of said second portion are light emitting diodes.

19. The lighting element of claim 1 wherein each said standoff has a dimension that determines said distance and that is a function of at least one of the type and color of light emitted by said light emitting devices.

20. The lighting element of claim 1 wherein said housing has a thin film thereon that influences light dispersion.

21. The lighting element of claim 1 wherein said housing has a pattern that influences light dispersion, said pattern being one of an etched pattern, a scratched pattern and a polished pattern.

22. The lighting element of claim 1 wherein said housing has a micro-optic pattern that is molded therein and that influences light dispersion.

23. The lighting element of claim 1 further comprising circuitry that includes a sensor and that is coupled between said electrical conductors and said base, said circuitry being responsive to detection of a condition by said sensor for adjusting the amount of illumination produced by at least some of said light emitting devices.

24. The lighting element of claim 23 wherein said sensor is one of a motion sensor, a sound sensor, and a light sensor.

25. A lighting element, comprising:
a housing having a base and a form, which housing has an inside wall;
a substrate including electrical conductors in connection with said base and conforming substantially to said inside wall; and
a plurality of light emitting devices located on said substrate in electrical connection with said substrate;
wherein said substrate further comprises relief spots interposed between said flexible substrate and said housing for providing a distance between said substrate and said housing.

26. A lighting element, comprising:
means for housing a plurality of light emitting elements, said housing means having a desired form;
means for supporting said plurality of light emitting elements inside of said housing and in substantial conformity to said form;
means for energizing said plurality of light emitting elements; and
means for spacing said plurality of light emitting elements from said housing means for adjusting the dispersion of light emitted from said lighting device.

27. The lighting element of claim 26 wherein said light emitting diodes are lensless light emitting diodes.

28. A lighting element, comprising:
means for housing a plurality of light emitting elements, said housing means having a desired form;
means for supporting said plurality of light emitting elements inside of said housing and in substantial conformity to said form, including means for relief for spacing said plurality of light emitting elements from said housing means for adjusting the dispersion of light emitted from said lighting device; and
means for energizing said plurality of light emitting elements.

29. A method for manufacturing a lighting device, comprising:
providing a housing of a desired form for accommodating at least one light emitting element;
forming a flexible substrate which is capable of conforming to said desired form;
connecting said at least one light emitting element having a first function on said flexible substrate so as to provide said first purpose;
inserting said flexible substrate into said housing so as to provide said first purpose;
connecting said flexible substrate to said housing with electrical leads; and
interposing at least one standoff between said flexible substrate and said housing for providing a distance between said substrate and said housing.

30. The method for manufacturing a lighting device of claim 29 including connecting at least one further light emitting element having a second function on said flexible substrate so as to optimize said second function.

31. The method for manufacturing a lighting device of claim 29 further comprising: supporting said flexible substrate in conformity to said housing.

32. The method for manufacturing a lighting device of claim 29 wherein said providing a housing further comprises: shaping said housing to define the light dispersion pattern emitted from said housing.

33. A method for manufacturing a lighting device, comprising:
providing a housing of a desired form for accommodating at least one light emitting element;
forming a flexible substrate which is capable of conforming to said desired form;
connecting said at least one light emitting element having a first function on said flexible substrate so as to provide said first purpose;
inserting said flexible substrate into said housing so as to provide said first purpose; and
connecting said flexible substrate to said housing with electrical leads;
wherein said providing a housing comprises providing a housing with relief spots interposed between said flexible substrate and said housing for providing a distance between said substrate and said housing.

* * * * *